United States Patent
Oki et al.

(10) Patent No.: US 7,491,090 B2
(45) Date of Patent: Feb. 17, 2009

(54) PLUGGABLE OPTICAL TRANSCEIVER WITH A GROUND FINGER

(75) Inventors: Kazushige Oki, Kanagawa (JP); Hiromi Kurashima, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/713,104

(22) Filed: Mar. 2, 2007

(65) Prior Publication Data

US 2007/0207673 A1   Sep. 6, 2007

(30) Foreign Application Priority Data

Mar. 3, 2006   (JP) .............................. 2006-057980

(51) Int. Cl.
*H01R 13/648* (2006.01)
(52) U.S. Cl. .......................... 439/609; 439/939; 385/92
(58) Field of Classification Search ................ 439/607, 439/609, 939, 353, 357; 385/92
See application file for complete search history.

(56) References Cited

U.S. PATENT DOCUMENTS

| | | | |
|---|---|---|---|
| 6,036,544 A * | 3/2000 | Brunker et al. | 439/607 |
| 6,335,869 B1 | 1/2002 | Branch et al. | |
| 6,368,153 B1 * | 4/2002 | Hwang | 439/607 |
| 6,416,361 B1 * | 7/2002 | Hwang | 439/607 |
| 6,491,530 B2 * | 12/2002 | Koide et al. | 439/92 |
| 6,612,868 B2 * | 9/2003 | Hwang | 439/607 |
| 2004/0105633 A1 | 6/2004 | Ishikawa et al. | |

* cited by examiner

*Primary Examiner*—Truc T Nguyen
*Assistant Examiner*—Xuong M Chung-Trans
(74) *Attorney, Agent, or Firm*—Venable LLP; Michael A. Sartori; Steven J. Schwarz

(57) ABSTRACT

The pluggable optical transceiver of the present invention provides a tailed finger that comes in contact with the inner surface of the cage by pushing outward by the optical connector when the optical connector mates with the optical receptacle. While, when the optical receptacle of the transceiver is free from the optical connector, the tailed finger protrudes into the optical receptacle and no influence is affected to insert the transceiver into or to extract the transceiver from the cage.

12 Claims, 5 Drawing Sheets

PLUGGABLE OPTICAL TRANSCEIVER WITH A GROUND FINGER

BACKGROUND OF THE INVENTION

1. Field of the Invention

The present invention relates to an optical transceiver used in an optical LAN system and transmits/receives optical signals, in particular, the invention relates to an optical transceiver with a pluggable function to a host system.

2. Related Prior Art

An optical pluggable transceiver, which installs a light-emitting device and a light-receiving device and transmits or receives optical signals by mating with an optical connector, includes a body to enclose a plurality of electronic components and a substrate for mounting the electronic components and an optical receptacle to mate with the optical connector. As disclosed in the United States Patent published as US 2004/105633A, the pluggable transceiver is used such that the transceiver is inserted into a cage that is installed on the host system and is engaged in an electronic plug provided in the rear end of the transceiver with an electronic connected installed in a deep end of the cage.

FIG. 4 illustrates a conventional pluggable transceiver 1 and a cage 2 on the host board 4. The optical transceiver 1 provides the optical receptacle 6 and a body 5 with a rectangular cross section and made of metal. Within the optical transceiver 1 is installed with optical devices, such as a light-emitting device and a light-receiving device, some electronic circuits to drive the light-emitting device or to amplify a signal output from the light-receiving device, and a circuit board to mount the electronic circuits. The optical transceiver 1 is inserted into the cage 2 that exposes an opening 3a on a front bezel 3 of the host system and is mounted on the host board 4. The transceiver 1 is inserted into the opening 3a of the cage 2 and the electronic plug provided in the rear end thereof mates with the electronic connected provided in the deep end of the cage to communicate the transceiver 1 with the host system.

The optical receptacle 6 mates with an optical plug 7, which couples an optical fiber in the optical plug 7 with the optical devices in the optical transceiver to carry out the optical communication therebetween. The optical plug 7 may have a type to be latched with the optical receptacle, such as the LC type optical connector. Furthermore, the optical transceiver 1 provides a bail 8 around the optical receptacle 6 to release the optical transceiver 1 from the cage. That is, when the optical receptacle is free from the optical plug 7, the optical transceiver 1 may be disengaged from the cage by rotating the bail in front of the optical receptacle 6.

FIGS. 5A and 5B illustrate the optical transceiver 1 inserted into the cage 2, in particular, FIG. 5A shows that the optical receptacle 6 is free from the optical plug 7, while, FIG. 5B shows when the optical plug 7 is set within the optical receptacle 6. The cage 2 provides a plurality of fingers 2a around the opening 3a, which comes in contact with the edge of the opening 3a in the bezel 3 when the cage, in particular, the opening 3a thereof exposes from the bezel 3 by mounting the cage 2 on the host board 4 to electrically come the cage 2 in contact with the ground of the bezel 3. Although the cage 2 is grounded to host board 4, it is quite preferable to ground an electrical component at a plurality of positions with a shorter wiring length as possible to reduce noises with high frequency components.

That is, to make the cage finger 2a at the peripheral of the opened edge of the cage 2 contact to the bezel 3 may reliably shield a gap between the cage and the opening 3a of the bezel 3, which may prevent the noise generated in the host system and having high frequency components not only leaking from the gap but also invading therefrom.

Moreover, as disclosed in the United States Patent, U.S. Pat. No. 6,335,869, the metal cover 5 of the transceiver 1 provides a plurality of elastic fingers 5a that come in contact with the inner surface of the cage 2 when the transceiver 1 is inserted within the cage 2. Thus, the metal cover 5 may come in electrically contact with the cage 2 by the fingers 5a, which grounds the metal cover 5 and shortens the length from the cover 5 to the bezel 3. The elastic fiber 5a may be called as an EMI (Electro-Magnetic Interference) finger or a ground finger.

As shown in FIGS. 5A and 5B, the elastic finger 5a is generally formed by making a U-shaped slit in the metal cover and tapping out a portion surrounded by the slit, or by welding a tab bent in advance with the metal cover 5. However, depending on the dimensional tolerance of the cover 5 and the cage 2, and the condition to insert the transceiver 1 into the cage 2, the reliability of the contact between the finger 5a and the cage 2 varies, which causes the electrical instability of the transceiver 1.

On the other hand, to strength the elasticity of the finger 5a to secure the contact against the cage 2 will make it difficult to insert the transceiver 1 into the cage 2 or to extract therefrom. Moreover, the finger 5a with a conventional configuration is easy to deform by iterating the insertion or extraction of the transceiver 1. In addition, the cage 2 has a large dimensional tolerance because it is formed by bending a metal plate, which causes the unreliable contact between the cage 2 and the finger 5a.

SUMMARY OF THE INVENTION

The present is, to solve subjects disclosed above, to provide a pluggable optical transceiver that can securely ground the cover thereof when the optical receptacle receivers the optical connector, while can smoothly manipulate the transceiver to insert into or to extract from the cage when the optical receptacle thereof is free from the optical connector.

The pluggable optical transceiver according to the present invention is used as being inserted into an opening of a metal cage, where the cage is installed in a host system that includes a board and a bezel. The opening of the cage exposes in the bezel. The transceiver of the present invention comprises an optical receptacle, a cover and a tailed finger. The optical receptacle has an opening to receive an optical connector therein. The cover is assembled with the optical receptacle so as to expose the opening of the optical receptacle to receive the optical connector. The tailed finger is attached with the cover. The present optical transceiver has a feature that the tailed finger extrudes into the optical receptacle when the optical receptacle is free from the optical connector, while, it comes in contact with the cage when the optical receptacle receives the optical connector.

DESCRIPTION OF PREFERRED EMBODIMENTS

Figure 1:
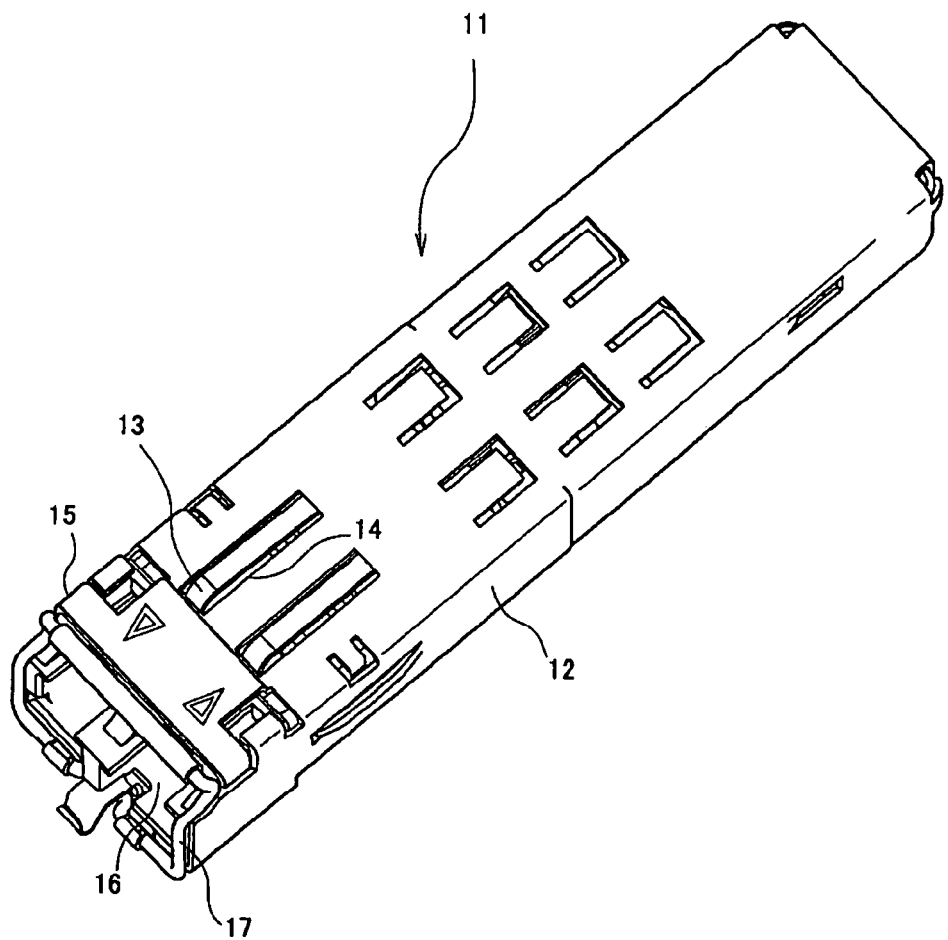
FIG. 1 shows an external appearance of the pluggable optical transceiver according to one embodiment of the present invention.
Figure 3A:
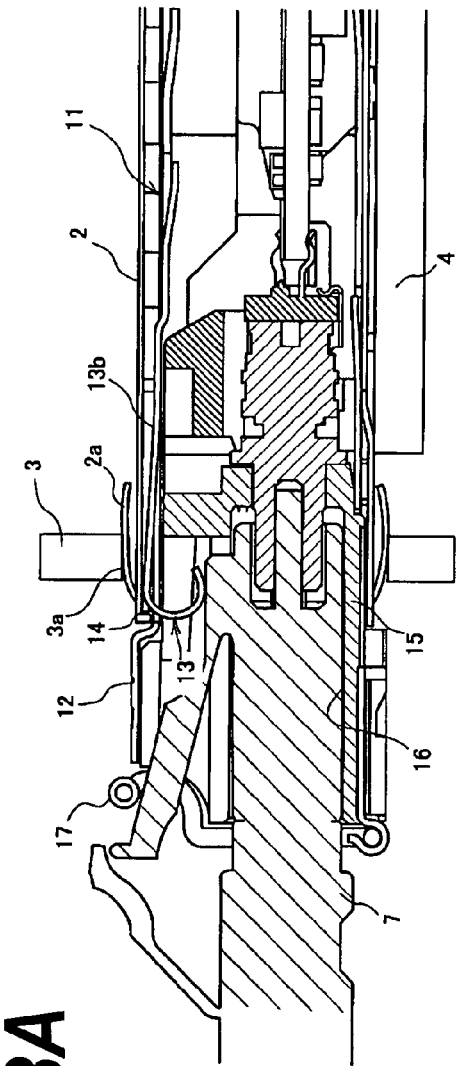
FIG. 3A is a cross section of a front end portion of the optical transceiver, when the optical receptacle thereof receives the optical connector, according to the second embodiment of the invention, FIG. 3B magnifies the portion where the tailed finger comes in contact with the optical connector by the curled portion and with the cage by the latch tab.
Figure 3B:
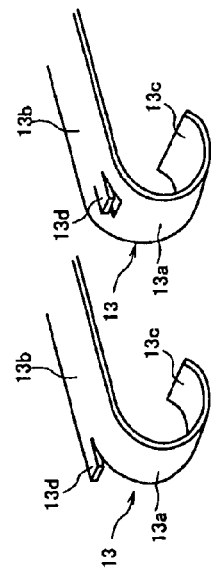
FIG. 3C shows two types of latch tab of the tailed finger.
Figure 3C:
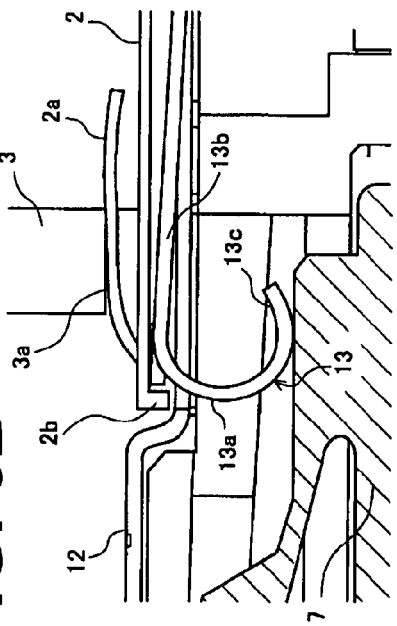

The present invention will be described as referring to accompanying drawings. FIG. 1 is a perspective view of a pluggable transceiver according to the present invention. FIGS. from 2A and 3B show a receptacle portion of the optical transceiver and FIG. 3C shows a tail tab.

The optical transceiver 1 according to the present embodiment, as shown in FIG. 1, has a fundamental structure similar to those appeared in a conventional transceiver, that is, the transceiver 1 includes a metal cover 12 that covers a whole portion of the transceiver and has a substantially rectangular cross section, and an optical receptacle 15 provided in a front side of the transceiver that exposes from the metal cover 12. The optical receptacle 15 exposes two openings 16 with which the optical connector 7 is mated. The receptacle 15 also provides a bail 17 in the front end thereof. The bail 17, by pulling frontward, may release the transceiver 1 from the cage 2.

The transceiver 1 installs a transmitter optical sub-assembly, often called as TOSA, a receiver optical sub-assembly, often called as ROSA, electronics circuit that drive the TOSA and amplifies a faint electrical signal converted by the ROSA, and a substrate for mounting the electronic circuits. The substrate provides an electrical plug in rear end thereof. Here, the front direction merely corresponds to a side where the optical receptacle is provided, while, the rear direction corresponds to a side where the electrical plug is installed. No functional distinction except for the direction thereof is appeared. When the transceiver 1 is inserted into the cage such that the electrical plug in the rear end of the substrate engages with the electrical connector installed in the deep end of the cage on the host board, the optical transceiver 1 can communicate with the host system. Moreover, the receptacle may provide a mechanism in the bottom of the receptacle. The mechanism may latch the transceiver 1 with the cage, or may de-latch the transceiver 1 from the cage. The latching/de-latching mechanism is not shown in figures.

The metal cover 12 of the present embodiment, which covers a whole portion of the transceiver 1, provides a plurality of fingers to ground the transceiver 1, in particular, the cover 12 thereof to the bezel 3 via the cage 2 by coming in contact with the inner wall of the cage 2. It is preferable to make the fingers in contact with the cage as close to the opening 3a of the bezel 3 as possible. Accordingly, the present optical transceiver provides a plurality of tail fingers 13 that comes in contact not only with the body of the transceiver 1 but also with the optical connector 17.

Figure 2A:
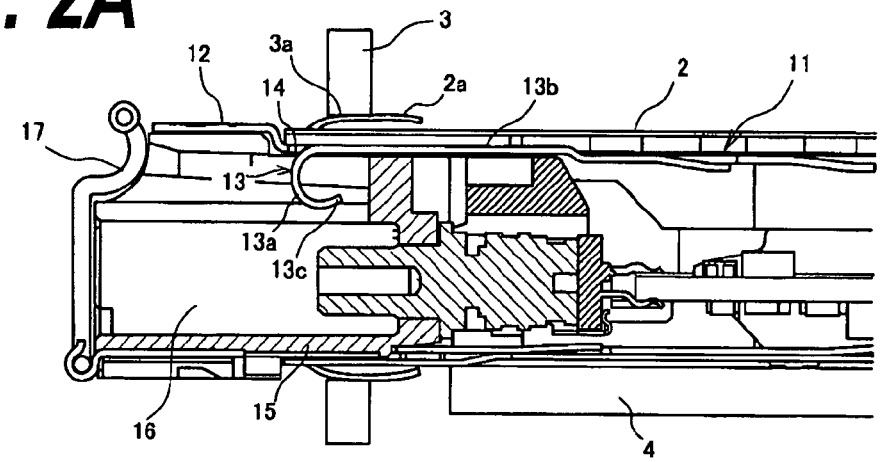
FIG. 2A is a cross section of a front end portion of the optical transceiver, when the optical receptacle is free from the optical connector, according to the first embodiment of the invention.
Figure 2B:
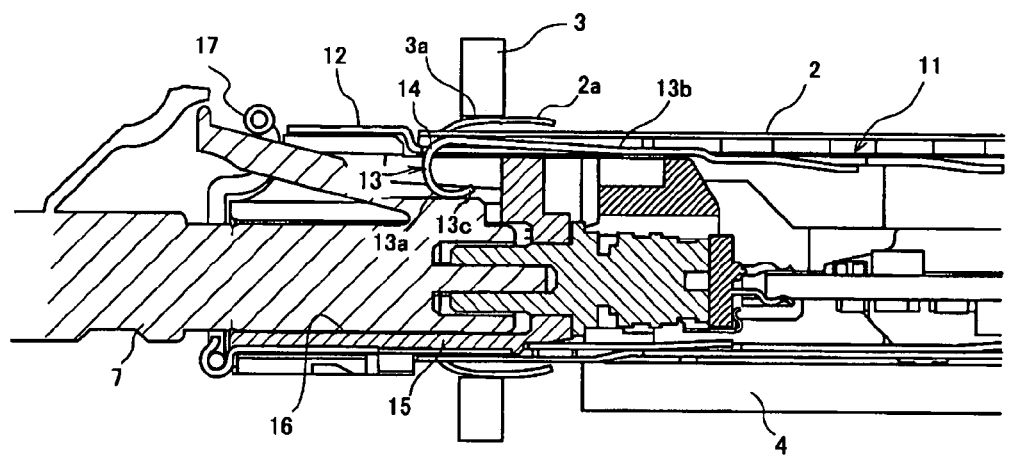
FIG. 2B is a cross section of the optical transceiver when the optical receptacle receives the optical connector.
Figure 4:
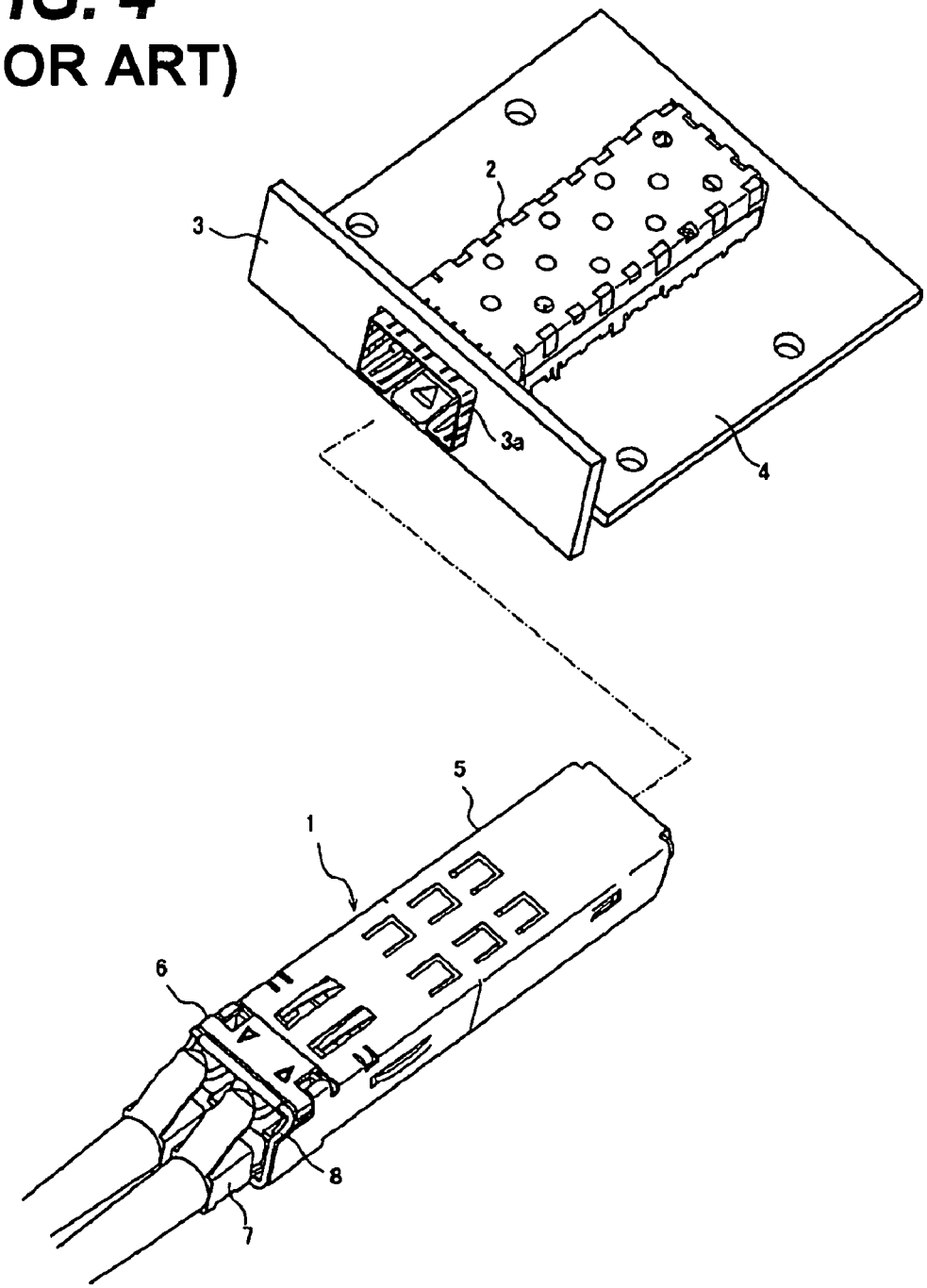
FIG. 4 shows a perspective view of the conventional optical transceiver that is to be inserted into the cage on the host board.
Figure 5A:
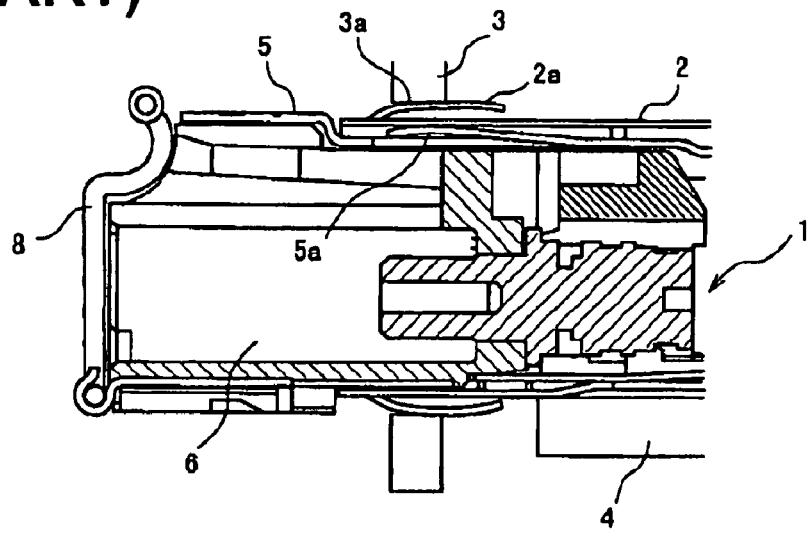
FIG. 5A is a cross section of the front end portion of the conventional optical transceiver where the optical receptacle thereof is free from the optical connector.
Figure 5B:
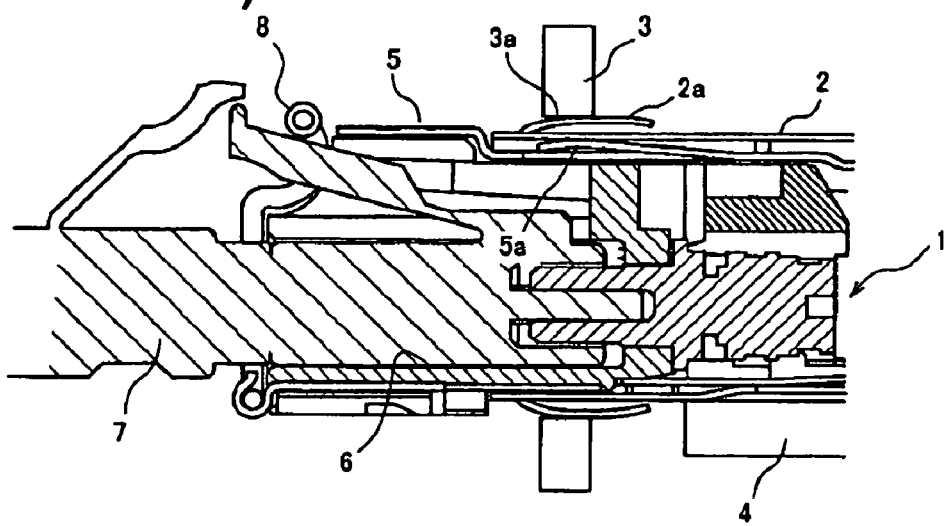
FIG. 5B is a cross section of the conventional optical transceiver when the optical receptacle receivers the optical connector therein.

FIG. 2A is a cross section of the transceiver 1 of the present embodiment with the receptacle 15 thereof being free from the optical connector 7, while, FIG. 2B is a cress section of the transceiver 1 when the optical connector 7 is mated with the optical receptacle 15. The cage 2 provides a plurality of finger 2a in the peripheral of the opening into which the transceiver 1 is inserted, as those in the conventional configuration shown in FIGS. 4 and 5. The cage finger 2a may come in contact with the edge of the opening 3a in the bezel 3 when the substrate 4 mounts the cage 2 thereon and the front end of the cage 2 exposes from the opening 3a of the bezel 3, which electrically grounds the cage 2 to the bezel 3.

The cage 2 is generally grounded on the host board. However, it is effective to ground the cage 2 at positions close to the front opening to reduce noises, especially, noises with high frequency components. Moreover, the cage fingers 2a may effective to shield a gap around the outer peripheral of the cage opening 3a with respect to the inner edge of the opening 3a of the bezel 3. Thus, the cage fingers 2a may not only suppress noises with high frequency components generated within the host system from leaking from the gap but also prevent noises from invading in the host system.

The transceiver 1 of the present embodiment, as shown in FIG. 2A, provides a plurality of tailed fingers 13 around the front end of the metal cover 12. The tailed finger 13 configures a curled portion 13a and a flat portion 13b. The tip 13c of the curled portion 13a is bent inward so as not to come in contact anywhere. When the optical receptacle 15 is free from the optical connector 7, the tailed finger 13 is set within the optical receptacle 15 so as to be hidden in a slot 14.

Thus, the tailed finger 13 is set within the receptacle 16 and is free from the inner surface of the cage 2 when no force is applied thereto. Or, even if the tailed finger 13 comes in contact with the inner surface of the cage 2, the finger 13 softly touches the cage 2. Accordingly, a mechanical relation between the cage 2 and the transceiver 1 is substantially free with respect to each other, which causes no impediment to the manipulation of the transceiver 1, the insertion into or the extraction from the cage 2.

As shown in FIG. 2B, when the receptacle 15 receives the optical connector 7 in the opening 16 thereof, the top surface of the connector 7 pushes the curled portion 13a of the tailed finger 13 upward. The tailed finger 13 in the flat portion 13b thereof extrudes from the slit 14 of the metal cover 12 and reliably touches to the inner wall of the cage 2. The curled portion 13a of the tailed finger 13 shows an elastic force to abut the flat portion 13b thereof against the cage 2, which may secure the electrical contact between the tailed finger 13 and the cage 2.

An LC type connector is applicable to the optical connector 7. The LC connector provides a latch tab to automatically engage the connector 7 with the receptacle 15 by inserting the connector 7 into the receptacle 15. Moreover, the tip of the curled portion 13a of the tailed finger is bent inward, which prevent the tip 13c from coming in contact with the connector, only the bent portion of the tailed finger 13 may come in contact with the connector 7. Accordingly, the connector is not scratched by the tip 13c and is secured for the smooth engagement with the receptacle 15.

The tailed finger 13 may be formed by, making a U-shaped slit in the metal cover and tapping out a portion surrounded by the slit so to curl an tip end thereof. However, the tailed finger 13 including the curled portion thereof requires a considerable length. When the portion surrounded by the slit has not enough length for the tailed finger 13, the tailed finger 13 may be independently formed in its shape and thus prepared finger 13 may be welded to the metal cover 12 so as to extrude the flat portion 13b thereof from the slit 14.

The tailed finger 13 recovers its original shape, which is shown in FIG. 2A, so as to hide the flat portion 13b within the slit 14 and to set the curled portion 13a within the receptacle 15, when the optical connector 7 is released from the receptacle 15. The tailed finger 13 is detached from the cage 2. In this position, to rotate the bail downward and to pull the bail frontward may release the engagement of the transceiver 1 with the cage 2 and may extract the transceiver 1 from the cage 2 without affecting the mechanical position between the tailed finger 13 and the cage 2.

FIGS. form 3A to 3C show an optical transceiver according to the second embodiment of the present invention. FIG. 3A illustrates the transceiver mated with the optical connector therein, and FIGS. 3B and 3C show a detailed configuration of the tailed finger of the second embodiment. The transceiver of this embodiment provides in a fundamental structure thereof the same with those in the first embodiment shown in FIG. 2. That is, the tailed finger 13 has the curled portion 13a and the flat portion 13b. Besides, the tip 13c of the curled portion is rounded inside.

However, as shown in FIG. 3C, the trailed finger 13 of the present embodiment provides, in a boundary between the curled portion 13a and the flat portion 13b, a latch finger 13d. In addition, the edge of the cage 2 provides a flange 2b bent inward to the opening, which abuts against the latch finger 13d when the cage 2 receivers the transceiver 1. The latch finger 13d protrudes frontward from the root of the curled portion 13a, which may be formed by picking up a center or side portion between the curled and flat portions.

When the receptacle 15 receives the optical connector 7 within the opening 16 thereof, similar to a case shown in FIG. 2B, the top surface of the connector 7 pushes the curled portion 13a of the tailed finger 13 upward such that the flat portion 13b extrudes from the slit 14 of the cover 12 to abut against the inner surface of the cage 2 by the elasticity of the curled portion 13a.

At the same time, the latch finger 13d, which is extended from the flat portion 13b, extrudes from the slit 14 and abuts, in the tip of the latch finger 13d, against the flange 2b in the edge of the cage 2, which prevents the transceiver 1 from slipping out from the cage 2. The optical connector 7, when it is mates with the optical receptacle 15, is prohibited to rotate frontward to release the engagement between the transceiver 1 and the cage 2. The present embodiment of the tailed finger 13 with the latch finger 13d and the flange 2d in the cage 2 further secures the engagement between the transceiver 1 and the cage 2, in addition to the latching mechanism inherently provided in the transceiver 1.

Extracting the optical connector 7 from the receptacle 15, the tailed finger 13 falls in the slit 14 and extrudes in the opening 16 of the receptacle 15. At the same time, the latch finger 13d becomes free from the flange 2b of the cage 2. Rotating the bail 17 frontward in this situation, the engagement between the transceiver 1 and the cage 2 may be released and the transceiver 1 is able to be extracted from the cage 2 without being obstructed from the latch finger 13d and the stress caused by the curled portion.

What is claimed is:

1. A pluggable optical transceiver inserted into an opening of a metal cage which is installed in a host system such that the opening of the cage exposes the optical transceiver, comprising:

an optical receptacle with an opening for receiving an optical connector;

a metal cover assembled with the optical receptacle so as to expose the opening of the optical receptacle to receive the optical connector; and a tailed finger attached with the cover, the tailed finger providing a curled portion and a flat portion continuous to the curled portion, the curled portion extruding into the opening of the optical receptacle, the flat portion being apart from the cage when the opening of the optical receptacle is free from the optical connector, wherein the tailed finger extrudes into the opening of the optical receptacle when the optical connector is not set in the opening of the optical receptacle and comes in contact with the cage when the opening of the optical receptacle receives the optical connector, and wherein the curled portion of the tailed finger is pushed out by the optical connector to make the flat portion of the tailed finger in contact with the cage when the opening of the optical receptacle receives the optical connector.

2. The optical transceiver according to claim 1, wherein the metal cover provides a slit, the flat portion of the tailed finger extruding from the slit to come in contact with the cage when the opening of the optical receptacle receives the optical connector.

3. The optical transceiver according to claim 1, wherein the curled portion elastically comes in contact with the optical connector when the opening of the optical receptacle receives the optical connector.

4. The optical transceiver according to claim 1, wherein the tailed finger is welded to the metal cover.

5. The optical transceiver according to claim 1, wherein the tailed finger is integrally formed with the metal cover.

6. An optical transceiver inserted into an opening of a metal cage which is installed in a host system such that the opening of the cage exposes the transceiver comprising:

an optical receptacle with an opening for receiving an optical connector;

a metal cover assembled with the optical receptacle so as to expose the opening of the optical receptacle to receive the optical connector; and a tailed finger attached with the cover, the tailed finger extruding into the opening of the optical receptacle when the optical connector is not set in the opening of the optical receptacle and coming in contact with the cage when the opening of the optical receptacle receives the optical connector, wherein the tailed finger further provides a latch tab to abut against the front end of the cage when the opening of the optical receptacle receives the optical connector such that the optical transceiver is prevented from slipping out from the cage.

7. An optical transceiver for insertion into a metal cage located on a host system, the optical transceiver comprising:

an optical receptacle including an opening for receiving an optical connector; and a metal cover assembled on the optical receptacle such that the opening for receiving the optical connector is exposed, the metal cover including a tailed finger;

wherein the tailed finger comprises a curled portion and a flat portion continuous with the curled portion, the curled portion extending into the opening of the optical receptacle;

wherein the flat portion of the tailed finger is disconnected from the cage when the optical connector is not located in the opening of the optical receptacle, and the curled portion of the tailed finger pushes the flat portion into contact with the cage when the optical connector is located in the opening of the optical receptacle.

8. The optical transceiver of claim 7, wherein the metal cover includes a slit, and the flat portion extends from the slit into contact with the cage when the optical connector is located in the opening of the optical receptacle.

9. The optical transceiver of claim 7, wherein the curled portion elastically contacts the optical connector when the optical connector is located in the opening of the optical receptacle.

10. The optical transceiver of claim 7, wherein the latch tab is welded to the metal cover.

11. The optical transceiver of claim 7, wherein the latch tab is integrally formed with the metal cover.

12. An optical transceiver for insertion into a metal cage located on a host system, the optical transceiver comprising:
　　an optical receptacle including an opening for receiving an optical connector; and
　　a metal cover assembled on the optical receptacle such that the opening for receiving the optical connector is exposed, the metal cover including a tailed finger;
　　wherein the tailed finger is disconnected from the cage when the optical connector is not located in the opening of the optical receptacle, and the tailed finger is positioned in contact with the cage when the optical connector is located in the opening of the optical receptacle, and
　　wherein the tailed finger comprises a latch tab adapted to engage a front end of the cage when the optical connector is located in the opening of the optical receptacle, thereby preventing the optical transceiver from moving out of the cage.

\* \* \* \* \*